(12) United States Patent
Cubon

(10) Patent No.: US 6,217,346 B1
(45) Date of Patent: *Apr. 17, 2001

(54) SOLDERLESS PIN CONNECTION

(75) Inventor: Michael M. Cubon, Northfield, IL (US)

(73) Assignee: Illinois Tool Works Inc., Glenview, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/309,353

(22) Filed: May 11, 1999

(51) Int. Cl.[7] .................................................. H01R 12/00
(52) U.S. Cl. .............................. 439/78; 439/931; 174/256
(58) Field of Search ................................ 439/83, 85, 78, 439/931, 936; 194/256, 257

(56) References Cited

U.S. PATENT DOCUMENTS

| 3,912,852 | * | 10/1975 | Simon | 439/85 |
| 4,181,387 | * | 1/1980 | Walters | 439/876 |
| 4,230,385 | * | 10/1980 | Ammon et al. | 439/85 |
| 4,656,314 | * | 4/1987 | Durand | 174/256 |
| 5,480,309 | * | 1/1996 | Arisaka | 439/85 |

OTHER PUBLICATIONS

ITW Chronomatic, An Illinois Tool Works Company, "A Practical Guide to the Use of Polymer Thick Film (PTF) in Automotive Applications" (1991).

* cited by examiner

*Primary Examiner*—Tulsidas Patel
(74) *Attorney, Agent, or Firm*—Pauley Petersen Kinne & Fejer

(57) ABSTRACT

A solderless pin connection for a printed circuit board wherein a substrate is printed with polymer thick film. The substrate includes an inner surface defining a hole. The polymer thick film is applied along a top surface of the substrate and along the inner surface. The polymer thick film may additionally be applied along a bottom surface of the substrate with an additional layer along the inner surface. A pin, having a diameter less than a diameter of the hole, is press fit within the polymer thick film along the inner surface the pin. The pin is staked with respect to the substrate using a mechanical connection such as barbs or a folded portion on a staked end of the pin.

15 Claims, 1 Drawing Sheet

SOLDERLESS PIN CONNECTION

BACKGROUND OF THE INVENTION

1. Field of the Invention

This invention relates to a solderless pin connection utilizing a press fit pin staked within a hole printed with polymer thick film.

2. Description of Related Art

Traditional printed circuit boards are manufactured by applying a layer of copper to a substrate and then etching the desired circuit into the layer of copper. This subtractive manufacturing process is step intensive and results in wasted materials. A perceived advantage of copper is its ability to maintain a soldered connection for electrical and mechanical connections. Staking a pin into a multi-processed copper plated through hole may result in a solder-free joint.

Soldered connections require additional complex and costly manufacturing steps and may result in unreliable connections. Waste from the soldering and plating processes is hazardous to the environment and expensive to dispose of safely. Further, manufacture of the plated through hole requires a lengthy process with many steps, including a drilled hole, that are critical to achieving a sound electrical connection. This lengthy plating process, combined with the assembly of the pin, may jeopardize the integrity of the plated through hole.

SUMMARY OF THE INVENTION

Polymer thick film (PTF) is a material and process used to create printed circuit boards and other products. Polymer thick film is an additive material and process for printed circuit board manufacturing that can improve reliability, product performance and quality and at the same time reduce overall component costs.

Polymer thick film comprises polymer resins filled with conductive particles that are screen printed and heat cured onto the surface of a printed circuit board substrate. A loading ratio can be varied to create materials having variable conductivities, depending on the application. The conductive particles can also be blended, such as a silver/carbon mixture, to achieve particular characteristics. Polymer thick film inks are used to create variable resistors, fixed resistors, conductors, insulating layers, switches and other devices on the surface of a printed circuit board.

According to this invention, a solderless pin connection for a printed circuit board is prepared using polymer thick film printed on a printed circuit board substrate. An inner surface of the substrate defines a hole, that may be drilled or punched into the substrate.

The polymer thick film is applied on a top surface of the substrate and along the inner surface. Additionally, the polymer thick film may be applied to a bottom surface of the substrate and in an additional layer along the inner surface.

A pin is subsequently press fit within the polymer thick film along the inner surface. The pin preferably has a pin diameter less than a diameter of the hole. The pin is retained within the hole using either the press fit connection, or preferably is staked into the hole using a mechanical connection such as barbs, a folded staked end portion of the pin, a shoulder positioned on the pin and/or teeth positioned on the shoulder.

The polymer thick film is preferably applied to the substrate by drawing the polymer thick film through the hole and along the inner surface from each side of the substrate. The resultant inner surface of the hole is consistently coated with the polymer thick film.

It is one object of this invention to provide a pin connection that does not require solder or traditional soldering procedures.

It is another object of this invention to provide a pin connection wherein a pin is press fit with respect to a substrate.

It is still another object of this invention to utilize polymer thick film with a pin connection.

It is yet another object of this invention to provide a pin connection that provides a reliable, consistent connection.

BRIEF DESCRIPTION OF THE DRAWINGS

The above-mentioned and other features and objects of this invention will be better understood from the following detailed description taken in conjunction with the drawings wherein.

DESCRIPTION OF PREFERRED EMBODIMENTS

A pin connection for a printed circuit board according to this invention is shown and described that does not require copper, a plated through hole or solder. According to a preferred embodiment of this invention, polymer thick film 30 is used in connection with the printed circuit board to effectuate such a solderless connection.

Figure 1:
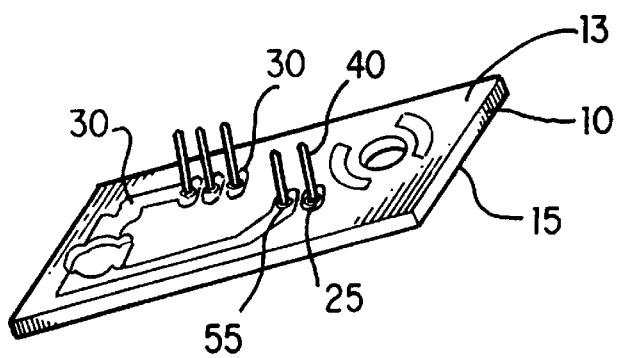
FIG. 1 is a perspective view of a printed circuit board according to one preferred embodiment of this invention.

Printed circuit boards are typically constructed on substrate 10 such as a fiberglass board or other substrate known to those having ordinary skill in the art. For the purpose of the Specification and claims, a printed circuit board may comprise any number of substrates 10 other than fiberglass, including plastic or other materials, because, unlike copper, polymer thick film is appropriate for use with a wide range of substrate materials. A representative printed circuit board is shown in FIG. 1.

Figure 2:
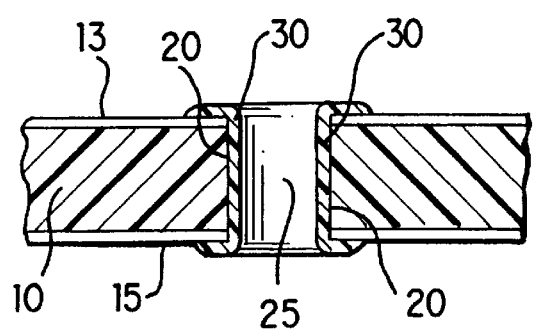
FIG. 2 is a cross-sectional side view of a hole having an inner surface printed with polymer thick film according to one preferred embodiment of this invention.

As shown in FIG. 2, at least one hole 25 is drilled or punched in substrate 10 to accommodate a corresponding pin connection. Hole 25 extends from top surface 13 of substrate 10 to bottom surface 15 of substrate 10. According to one preferred embodiment of this invention, hole 25 is punched thereby reducing the complexity of the assembly process and enabling a more precise hole position.

Figure 3:
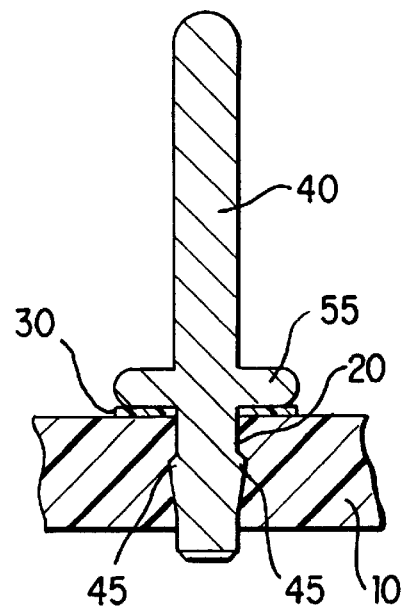
FIG. 3 is a cross-sectional side view of a pin connection on a single sided printed circuit board according to one preferred embodiment of this invention.
Figure 4:
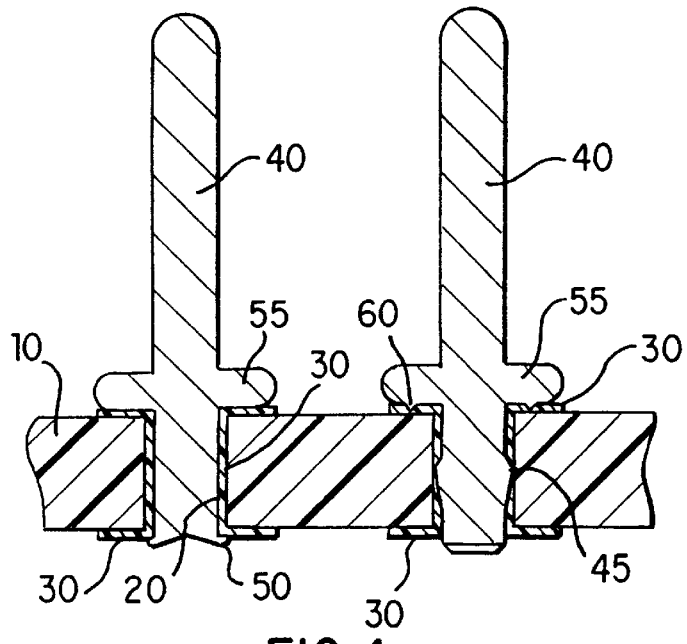
FIG. 4 is a cross-sectional side view of two alternative pin connections on a double sided printed circuit board according to one preferred embodiment of this invention.

In a single-sided printed circuit board arrangement, such as shown in FIG. 3, polymer thick film 30 is applied along top surface 13 of substrate 10. In a double-sided printed circuit board arrangement, such as shown in FIG. 4, polymer thick film 30 is applied along top surface 13 and bottom surface 15 of substrate 10. Depending upon the required application a printed circuit board may require printed circuits on one or both sides of substrate 10 in addition to solderless pin connections on one or both sides of substrate 10.

In addition, especially with respect to a double-sided printed circuit board, polymer thick film 30 is applied along inner surface 20 that defines hole 25. Because conventional application equipment applies polymer thick film 30 only along a horizontal or vertical plane, polymer thick film 30 should have a suitable viscosity during the application process to coat inner surface 30.

As shown in FIG. 2, polymer thick film 30 is preferably applied to a portion of top surface 13 and bottom surface 15 of substrate 10 surrounding hole 25 and in additionally layered along inner surface 20 that defines hole 25. According to one preferred embodiment of this invention, polymer thick film 30 is applied by using a vacuum positioned on one side of substrate 10 and drawing viscous polymer thick film 30 through hole 25. This procedure is then repeated on an opposite side of substrate so that viscous polymer thick film 30 is drawn through hole 25 from each side of substrate 10. The resultant hole 25 is preferably coated with a consistent layer of polymer thick film 30 on top surface 13 surrounding hole 25, bottom surface 15 surrounding hole 25 and inner surface 20 within hole 25. Hole 25 coated with polymer thick film 30 in this manner is typically referred to as a printed through hole.

Traditionally, holes in printed circuit boards have been plated or inserted with copper eyelets to enable double sided construction. The method and apparatus according to this invention avoids some of the problems encountered by these traditional methods. Eyelets are no longer accepted as a means of facilitating a double sided circuit in part because of unreliability. Plated through holes, though allowing conduction through the hole, involve a complex, multi-step process that is results in inconsistent plating and expensive manufacturing cycles.

During the application process according to one preferred embodiment of this invention, and prior to a curing process, polymer thick film 30 is often in an ink form. The curing process according to one preferred embodiment of this invention involves heating or baking the polymer thick film-coated substrate 10 at a predetermined temperature for a predetermined duration.

According to one preferred embodiment of this invention, pin 40 is press fit against polymer thick film 30 within hole 25. Pin 40 is preferably retained within hole 25 through the press fit and/or a mechanical connection as described below.

To effectuate an optimum connection, pin 40 preferably contacts a continuous layer of polymer thick film 30 throughout the entire inner surface 20 of hole 25. Therefore, pin 40 preferably has a pin diameter less than a diameter of hole 25. If pin 40 has a greater pin diameter than a diameter of hole 25 then pin 40 will scrape and push out most or all of polymer thick film 30 coated along inner surface 20 during insertion into hole 25.

Polymer thick film 30 is preferably blended with a conductive pigment such as a silver or carbon additive. Polymer thick film 30 is preferably manufactured and blended to exhibit specific physical characteristics. Polymer thick film 30 printed through holes have a typical resistance of 100 milliohms or less, and can conduct up to 1 amp per hole.

A viscosity of the polymer thick film ink as it is applied is important for achieving a reliable printed through hole. The viscosity preferably ranges between 16–34 on a viscometer 0–100 scale.

Once the polymer thick film ink is cured, a hardness of polymer thick film 30 is important to permit insertion of pin 40 into hole 25. Polymer thick film 30 should be malleable and preferably conform to a shape of an inserted end of pin 40. Based upon testing with a pencil hardness tester, the hardness of polymer thick film 30 is preferably between 6 H and 9 H. The hardness of polymer thick film 30 may be varied outside of this range depending upon how pin 40 is staked with respect to substrate 10 and depending upon the desired characteristics of polymer thick film 30.

Pin 40 may be staked with respect to polymer thick film 30 on inner surface 20 of substrate 10 using one or more mechanical connections. As shown in FIGS. 3 and 4, such mechanical connection may comprise barb 45 or other serration for digging or anchoring into polymer thick film 30 on inner surface 20 of substrate 10. Barb 45 may comprise any configuration known to those having ordinary skill in the art that will allow insertion of pin 40 into hole 25 using some degree of force but prevent accidental removal or loss of pin 40 from hole 25 under ordinary operating conditions.

According to one preferred embodiment of this invention also shown in FIG. 4, pin 40 may comprise folded region 50 staking pin 40 with respect to substrate 10. Pin 40 may be inserted into hole 25 and then compressed or bent at a staked end of pin 40 to create an overlapping or folded region 50 of pin 40 with respect to a surface of substrate 10 and/or polymer thick film 30 layered on substrate 10. The staked end of pin 40 may be compressed into a nest or similar mechanical device to create folded region 50 of pin 40.

As shown in FIGS. 1, 3 and 4, pin 40 may further comprise shoulder 55. As shown, shoulder 55 preferably protrudes radially from pin 40 to seat pin 40 firmly and predictably against substrate 10 and polymer thick film 30. According to one preferred embodiment of this invention shown in FIG. 4, shoulder 55 further comprises at least one tooth 60 for engaging with substrate 10 and/or polymer thick film 30. One or more teeth 60 are especially useful when pin 40 does not have barbs 45 or other mechanical connections on a portion of pin 40 within hole 25.

While in the foregoing specification this invention has been described in relation to certain preferred embodiments thereof, and many details have been set forth for purpose of illustration, it will be apparent to those skilled in the art that the solderless pin connection according to this invention is susceptible to additional embodiments and that certain of the details described herein can be varied considerably without departing from the basic principles of the invention.

I claim:

1. A solderless pin connection for a printed circuit board comprising:

a substrate having a substrate hole defining an inner surface;

a polymer thick film applied on a top surface of the substrate and along the inner surface to define a mounting hole;

a pin press fit within the polymer thick film and entirely though the mounting hole, the pin having a shoulder and a pin diameter less than a diameter of the substrate hole and greater than a diameter of the mounting hole.

2. The solderless pin connection of claim 1 wherein the polymer thick film comprises a silver mixture.

3. The solderless pin connection of claim 1 wherein the polymer thick film is applied to a bottom surface of the substrate and in an additional layer along the inner surface of the mounting hole.

4. The solderless pin connection of claim 1 wherein the polymer thick film is applied as a viscous ink having a viscosity between 16–34 on a viscometer 0–100 scale.

5. The solderless pin connection of claim 1 wherein the polymer thick film is cured to a hardness between 6 H and 9 H.

6. The solderless pin connection of claim 1 wherein the pin further comprises a plurality of barbs.

7. The solderless pin connection of claim 1 wherein the pin further comprises a folded region staking the pin with respect to the substrate.

8. The solderless pin connection of claim 1 wherein the shoulder further comprises at least one tooth for engaging with one of the substrate and the polymer thick film.

9. A solderless pin connection for a printed circuit board comprising:

- a substrate having substrate hole defining an inner surface, the substrate hole extending from a top surface to a bottom surface;
- a polymer thick film having a silver component applied to the substrate on the top surface and drawn through the substrate hole and along the inner surface from the bottom surface to define a mounting hole;
- the polymer thick film applied to the bottom surface and drawn through the substrate hole and along the inner surface from the top surface;
- a pin staked into the mounting hole with a mechanical connection, the pin having a shoulder extending radially from the pin.

10. The solderless pin connection of claim 9 wherein the mechanical connection comprises a plurality of barbs position on the pin.

11. The solderless pin connection of claim 9 wherein the mechanical connection comprises a folded over end of the pin.

12. The solderless pin connection of claim 9 wherein the polymer thick film is applied as a viscous ink and cured.

13. The solderless pin connection of claim 12 wherein a viscosity of the viscous ink preferably ranges between 16–34 on a viscometer 0–100 scale.

14. A solderless pin connection for a printed circuit board comprising:

- a substrate having an inner surface defining a substrate hole from a top surface to a bottom surface;
- a polymer thick film having a silver component applied to the substrate on the top surface and drawn through the substrate hole and along the inner surface from the bottom surface to define a mounting hole, the polymer thick film having a hardness between 6 H and 9 H;
- the polymer thick film applied to the bottom surface and drawn through the substrate hole and along the inner surface from the top surface;
- a pin staked into the mounting hole with a mechanical connection, the pin having a shoulder abutting one of the top surface or the bottom surface of the substrate.

15. The solderless pin connection of claim 14 wherein the polymer thick film is applied as a viscous ink having a viscosity between 16–34 on a viscometer 0–100 scale.

\* \* \* \* \*